United States Patent

Poole

[19]

[11] Patent Number: 5,976,263
[45] Date of Patent: Nov. 2, 1999

[54] SOURCES USED IN MOLECULAR BEAM EPITAXY

[75] Inventor: David Charles Poole, West Sussex, United Kingdom

[73] Assignee: Thermo Instrument Systems, Inc., Waltham, Mass.

[21] Appl. No.: 09/011,033

[22] PCT Filed: Aug. 2, 1996

[86] PCT No.: PCT/GB96/01882

§ 371 Date: Jul. 8, 1998

§ 102(e) Date: Jul. 8, 1998

[87] PCT Pub. No.: WO97/06292

PCT Pub. Date: Feb. 20, 1997

[30] Foreign Application Priority Data

Aug. 3, 1995 [GB] United Kingdom ................ 9515929

[51] Int. Cl.$^6$ .................................................. C23C 14/00
[52] U.S. Cl. ........................................................ 118/726
[58] Field of Search .............................................. 118/726

[56] References Cited

U.S. PATENT DOCUMENTS

| 4,550,411 | 10/1985 | Stonestreet et al. | 373/134 |
| 4,856,457 | 8/1989 | Knauer | 118/666 |
| 5,026,454 | 6/1991 | Parmenter et al. | 156/614 |

FOREIGN PATENT DOCUMENTS

| 0 472 316 A2 | 2/1992 | European Pat. Off. . |
| 3715644 A1 | 12/1988 | Germany . |
| 59-54696 | 3/1984 | Japan . |
| 60-225421 | 11/1985 | Japan . |
| 5-85888 | 6/1993 | Japan . |

OTHER PUBLICATIONS

"Multiholed–Plug Cell for Molecular Beam Source", by Takashi Nomura et al., *Bulletin Research Institute for Electron*, vol. 19, pp. 37–42, 1984.

"Multiholed Plug Effusion Cell", by Takashi Nomura et al., *Journal Vacuum Society of Japan*, vol. 29, pp. 309–314, 1986.

"Angular Distribution of Molecular Beams From Modified Knudsen Cells for Molecular–Beam Epitaxy", by L.Y.L. Shen, *Journal of Vacuum Science and Technology*, vol. 15, pp. 10–12, 1977.

*Primary Examiner*—Richard Bueker
*Attorney, Agent, or Firm*—Westman, Champlin & Kelly, P.A.

[57] ABSTRACT

A source for Molecular Beam Epitaxy (MBE) including an open-ended crucible and a removable orificed covered plate for covering the open end of the crucible, the cover plate having an encapsulated heater, preferably of Pyrolytic Graphite, which reduces orifice blockage.

10 Claims, 7 Drawing Sheets

SOURCES USED IN MOLECULAR BEAM EPITAXY

The invention relates to apparatus for depositing layers of semiconductor material upon a substrate under vacuum conditions. More specifically, the invention relates to Molecular Beam Epitaxy apparatus, particularly to an improved source design for use in such apparatus.

There are many deposition techniques which may be used in the manufacture of semiconductor devices. One such technique is Molecular Beam Epitaxy (MBE), in which epitaxial (i.e. single-crystal) layers of materials are deposited upon a substrate wafer. The technique involves placing the material which is to be deposited inside the crucible of an MBE source within an ultra-high vacuum (UHV) system ($<10^{-10}$ Torr), and heating the crucible. The material is thus vaporized and a beam of the material is formed, the characteristics of which depend on the source design. In MBE, the beam is a so-called "molecular beam", which can be defined as a collimated beam of atoms or molecules at low pressure, in which all the particles are travelling in the same direction and few collisions occur between them. This molecular beam travels from the source to impinge upon a substrate wafer where the material is deposited. Layers of different materials are formed by providing a plurality of sources containing, for example, Gallium, Indium, Aluminium, Arsenic, etc. In this way, semiconductor devices may be manufactured.

The deposited layers must fulfill stringent criteria in order to be useful for device manufacture. One requirement to be satisfied is that the layers must be uniform. Commonly, the substrate is rotated in order to improve the uniformity of deposition. Other requirements are freedom from impurities and surface defects. As mentioned, the source design greatly affects the nature of the layers, and much research has been performed on the properties and behavior of various different source designs.

FIGS. 1a–1e are diagrammatic representations of various known source configurations, and FIGS. 2a–2e show the profile of the layer deposited using each configuration. The figures are not to scale.

Figure 1A:
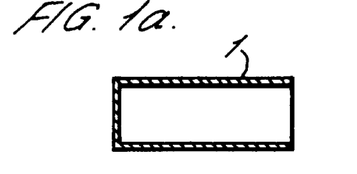
FIGS. 1a–1e are diagrammatic representations of various known source configurations.

FIG. 1a shows a simple cylindrical crucible (1) with an open neck, known conventionally as a K-cell. This makes good use of the heated volume, and a high vapour flux may be obtained. As can be seen from FIG. 2a the layer uniformity over the central portion of the wafer (2) is fairly good, but the uniformity falls off towards the edges of the wafer. If a smaller wafer is used, spanning only the central portion, layer uniformity is improved but a large amount of material misses the wafer and goes to waste. Another drawback of the open-necked cylindrical crucible is that as the level of material in the crucible decreases, the length of crucible through which the vaporized material leaving the surface of the material must pass before exiting the crucible mouth is increased, which results in increased collimation of the "beam", of vapour. Thus, since the degree of collimation changes as the level of material becomes lower, the beam profile alters over time, reducing the reproducibility of substrate deposition, and the stability of deposition over time. Another problem is that recondensed droplets of material at the neck of the crucible result in oval defect formation on the substrate. A common solution to this problem is to provide the source with additional heating means around its open end, thus forming a two-zone source.

Figure 1B:
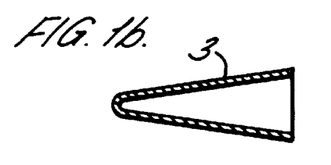

FIG. 1b shows a conical crucible (3), which addresses some of the problems of the cylindrical crucible. This is also a type of conventional K-cell. Because of the shape, the "beam collimation" problem is less relevant. As can be seen from FIG. 2b, layer uniformity is also good, although material wastage is high. The design of the conical crucible does not, however, avoid the problem of oval defects, although as before, additional heating means may be provided so as to form a two-zone source. Furthermore, heat loss is higher due to the wide mouth, and the use of the heated volume is inefficient. Another problem is that as the level of material in the crucible falls, the surface area of material decreases so that the material flux also decreases, thus layers take longer to build up.

Figure 1C:
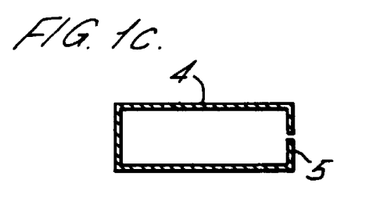
Figure 1D:
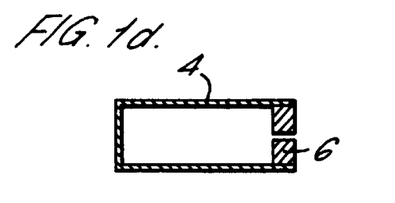
Figure 2A:
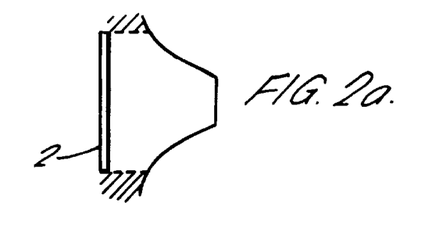
FIGS. 2a–2e show the profile of the layer deposited using the configurations of FIGS. 1a–1e, respectively.
Figure 2B:
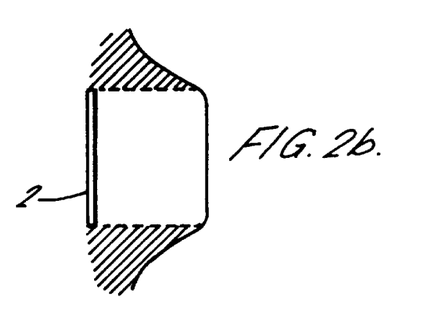
Figure 2C:
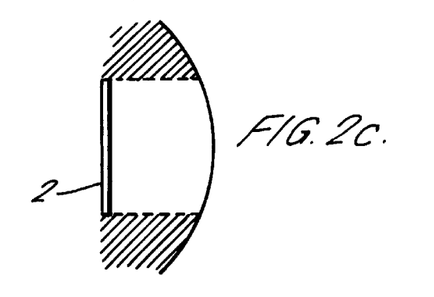
Figure 2D:
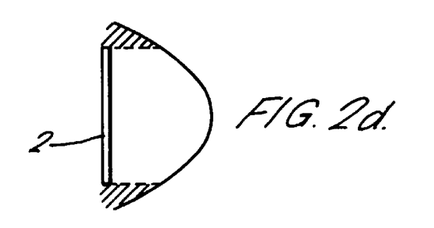

Another crucible design is shown in FIG. 1c. This is a cylindrical crucible (4) having a thin flat cover plate (5) which has a circular orifice. This is a true Knudsen effusion source, producing a molecular beam of material. The terms "Knudsen effusion" or "Knudsen source" refer to the type of material flow produced by the source—Knudsen flow occurs at low pressures when the mean free path of the molecules or atoms forming a gas is large compared with the dimensions of the pipe or channel through which the gas is flowing. The operating characteristics of Knudsen MBE sources affect the characteristics of the molecular beam formed and thus the characteristics of the deposited layer. The FIG. 1c design, as can be seen from FIG. 2c, produces fairly good uniformity across the wafer. Significant drawbacks of this design, however, are the very high material wastage and the low flux. Another known design, related to that of FIG. 1c, is shown in FIG. 1d. This is a closer approximation to a true Knudsen source, and indeed is conventionally known as a Knudsen cell. The orifice plate (6) is thicker, which results in greater collimation of the beam. FIG. 2d shows that material wastage is thus much diminished, although this is accompanied by a loss of uniformity over the wafer.

Some characteristics are Common to 1c and 1d. Since the nature of the beam is defined by the orifice dimensions, rather than by the amount of material in the crucible, the uniformity will remain constant as the material is depleted. Further, the cover plate separates the interior of the crucible from the rest of the MBE oven so that thermal equilibrium may be maintained within the source. Also, since the orifice is displaced from the crucible wall, the effect of recondensed droplets is reduced, resulting in fewer oval defects. The presence of the orifice plate means that the crucible shape does not affect the beam characteristics. Thus, cylindrical crucibles may be used—these have larger capacities than corresponding conical crucibles, and make better use of the heated volume. The heat loss is also low because of the orifice plate. One serious drawback is that the narrow orifice is easily blocked.

Figure 1E:
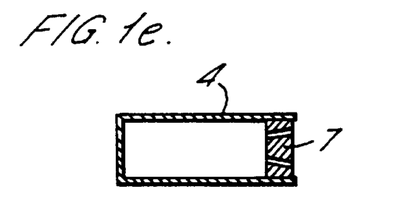

FIG. 1e shows one proposed design which has the above-mentioned advantages of the single-orifice sources 1c and 1d, while addressing the problems of uniformity and material wastage. This was suggested by Nomura and his co-workers in Bull. Res. Inst. Electron. Shizuoka University, Japan, vol. 19 (1) pp 37–42 (1984), (Nomura #1) and further discussed (also by Nomura et al) in J. Vac. Soc. Japan vol. 29 (7) pp 309–314 (1986) (Nomura #2).

The effusion source suggested by Nomura is similar to that shown in FIG. 1d in that it is a cylindrical crucible (4) with a thick cover plate (7). However, the cover plate disclosed by Nomura has formed within it a plurality of orifice channels, the longitudinal axis of each orifice channel being formed at an angle $\alpha$ (alpha) to the longitudinal axis of the crucible itself.

Figure 2E:
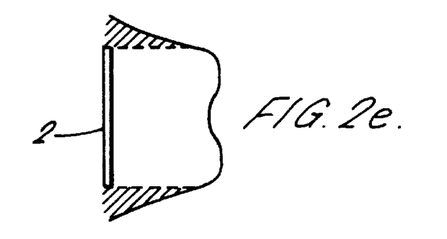

Nomura and his co-workers have studied the relationships between the uniformity or the layer distribution and various parameters of the multi-holed orifice plate. Having established suitable criteria for the various parameters of the source, Nomura et al calculate the expected beam intensity distribution for an 8-hole source. Such a source was also constructed and used to deposit Antimony onto a glass substrate by MBE. A diagram of the layer profile is shown in FIG. 2e. As can be seen from the figure, the layer distribution is much improved over that obtained with the other types of source. Uniformity over the wafer is substantially constant, and the beam falls off rapidly outside the wafer area, thus reducing material wastage.

The presence of a cover plate brings the advantages discussed earlier—uniformity of deposition over time, thermal equilibrium within the source, a reduction in the number of oval defects, large crucible capacity, good use of heated volume and low heat loss. However, the problem of orifice blocking still exists. Nomura et al attempt to address this problem by making the pitch of the heating wire smaller in the region of the orifice plate so as to form a two-zone source as discussed previously.

An earlier discussion of the multi-orifice MBE source was given by Shen in J. Vac. Sci. Technol., vol. 15, No 1, Jan/Feb 1978 pp 10–12. This paper compares the theoretical prediction of layer distribution on a substrate with actual results obtained. The Shen orifice plate has 240 small channels machined parallel to the crucible axis. The shape of the distribution obtained is a sharp peak which agrees with FIG. 4 of Nomura #2.

Consideration of all the above prior art, and especially the theoretical and experimental work carried out by Nomura and his co-workers, leads to the general conclusion that an increase in uniformity of layer deposition in an MBE source, together with the other aforementioned advantages, may be achieved by the use of a thick multi-holed orifice plate having a plurality of narrow orifices formed at an angle to the crucible axis. Both Nomura and Shen agree that the performance of the multi-holed source is critically dependent on the ratio between the length of the orifice and its diameter (Shen uses the radius). From FIG. 2 of Nomura #1 and FIG. 3 of Shen, we can see that for a ratio of L/d=10, the angular spread of the beam is less than 20°, most material being deposited within a spread of <10°. However, for smaller values of L/d, this directionality is lost. The optimum value chosen by Shen is L/d=10, while Nomura uses either L/d=10 or L/d=7.3. (It should be noted that the dashed line in FIG. 3 of Shen, corresponding to "the experimental measurement of a large hole with L/r=6" (i.e. L/d=3) does not correspond to a Knudsen source as defined above, since the "large opening" referred to is 0.84 cm in diameter and 2.54 cm long (see Shen p 12 Col 2 lines 4–8) and thus does not have the small orifice necessary for a true Knudsen source.)

However, problems occur when applying these results to a production MBE system. Under these conditions, it is important that the MBE system can run for as long as possible without needing to access the interior of the MBE oven, as each time the vacuum is broken the equipment may take as long as a few weeks to reattain the ultra-high vacuum necessary for defect-free crystal growth. In this regard, it is important that orifice blockages do not occur, since the down-time involved in unblocking the orifice would be extremely costly. If a source such as that proposed by Nomura or Shen were used in a production MBE apparatus depositing a material such as Gallium, Indium, Aluminium, Zinc, Cadmium or Tellurium, orifice blocking could be expected to occur rapidly (i.e. within a matter of days) even using the type of two-zone source proposed by Nomura, as these materials stick readily to a cool surface.

A further problem is that manufacture of cover plates with high values of L/d is a complicated and time-consuming operation. For a cap 2 mm thick the holes would have to be 0.2 mm in diameter and would tend to block up during manufacture, especially if using a growth process.

Another type of multi-holed cell is shown in JP-A-60225421 (Toshiba Corp.) This is a cylindrical crucible having an orifice plate which has orifice "slits" shaped like half-open trapdoors. This design aims to solve the "beam collimation" problem, obtaining a constant angle of beam divergence. This angle (shown as $\Theta_3$ in FIG. 2 of JP-A-60225421) is, however very large, and thus the directionality of the beam is not improved by the source shown in JP-A-60225421, merely the reproducibility of deposition. Also, the construction of the cover in JP-A-60225421 is very complicated and thus expensive to construct. Further, build-up of material around and inside the "slits" (6) in JP-A-60225421 would soon lead to orifice clogging and down-time.

It is an object of the present invention to provide an improved source for use in semiconductor deposition processes which addresses the problems of known sources. More particularly, it is a further object of the present invention to provide an MBE effusion source which avoids the problems associated with known MBE sources. It is a still further object of this invention to provide an effusion source which gives good layer uniformity whilst reducing material wastage. An additional object of this invention is to provide apparatus for the deposition of material by MBE using such a source.

According to one aspect of the invention there is provided a source for molecular beam epitaxy, the source including:

i. an open-ended crucible, ii. a removable cover plate for covering the open end of the crucible, at least one orifice being formed in the cover plate, and iii. a heating means for heating the cover plate, said heating means being formed on or within the cover plate.

The first heating means may be formed of a suitable refractory material on the surface of the cover plate. Advantageously, however, the heating means is encapsulated within the cover plate. Said heating means may consist of a layer of electrically conductive material encapsulated within the cover plate, the cover plate being formed of an electrically insulating material. The conductive layer which forms said heating means may be formed of a strip or wire of conducting material encapsulated within the cover plate, the ends of the strip or wire being connected to terminals via which current may be supplied to said heating means. Preferably, the cover plate and/or said integral heating means may be formed by a layer deposition process.

Advantageously, a portion of said heating means is disposed in the vicinity of the or each orifice, preferably substantially surrounding the orifice. The electrical resistance of the or each portion of said heating means which is in the vicinity of an orifice may be increased, so that more heat is generated near an orifice. This may be achieved, for example, by decreasing the cross-sectional area of that portion of said heating means.

According to another aspect of the invention there is provided a source for molecular beam epitaxy, the source including an open-ended crucible and a cover plate for covering the open end of the crucible, the cover plate having a plurality of orifice channels formed within it, the cover plate being outwardly convex in shape in at least the region where the orifices are formed, the longitudinal axes of each orifice being substantially perpendicular to the surface of the cover plate at the point where that particular orifice is located. Advantageously, the cover plate has a heating means integral with it. Preferably, the channels are cylindrical.

According to a further aspect, the invention provides apparatus for the deposition of layers on a substrate by Molecular Beam Epitaxy, said apparatus consisting of an evacuated housing containing a substrate holder for holding the substrate and one or more sources for generating a beam of material, the source and substrate being disposed so that material from the source is deposited upon the substrate, at least one said source consisting of:

i. an open-ended crucible for containing the material to be deposited,
  ii. a cover plate for covering the open end of the crucible, the cover plate having a plurality of orifices formed within it, the longitudinal axes of at least some of the orifices being formed at an angle to the longitudinal axis of the crucible, a first heating means being formed integrally with said cover plate,
  iii. a second heating means for heating the material contained within the crucible so that a beam of material vapour is generated.

According to a still further aspect of the invention there is provided apparatus for the deposition of layers on a substrate by Molecular Beam Epitaxy, said apparatus consisting of an evacuated housing containing a substrate holder for holding the substrate and one or more sources for generating a beam of material, the source and substrate being disposed so that material from the source is deposited upon the substrate, at least one said source including an open-ended crucible and a cover plate for covering the open end of the crucible, the cover plate having a plurality of orifice channels formed within it, the region of the cover plate where the orifices are formed being profiled so that when the crucible is in use, the longitudinal axes of the channels are disposed at an angle to the said substrate which angle is closer to the normal than the longitudinal axis of the crucible. Preferably, the longitudinal axes of the channels are substantially mutually parallel. Advantageously, the cover plate has a heating means integral with it. Preferably, the channels are cylindrical. Advantageously, the region of the cover plate where the orifices are formed is substantially flat. Preferably, the longitudinal axes of the orifice channels are perpendicular to the plane of the region of the cover plate where the said orifices are formed.

An example of the invention will now be described in greater detail with reference to the accompanying drawings, in which.

Figure 3:
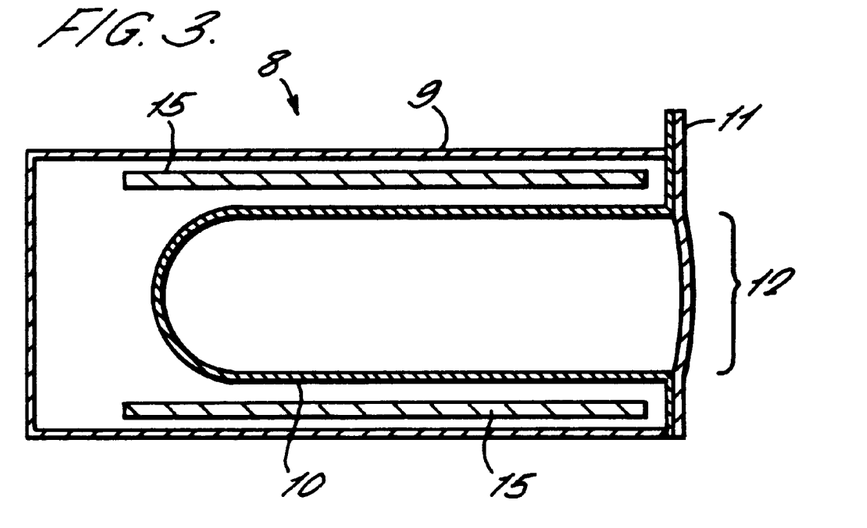
FIG. 3 is a diagrammatic representation of an MBE source according to the present invention, shown in cross-section.
Figure 4:
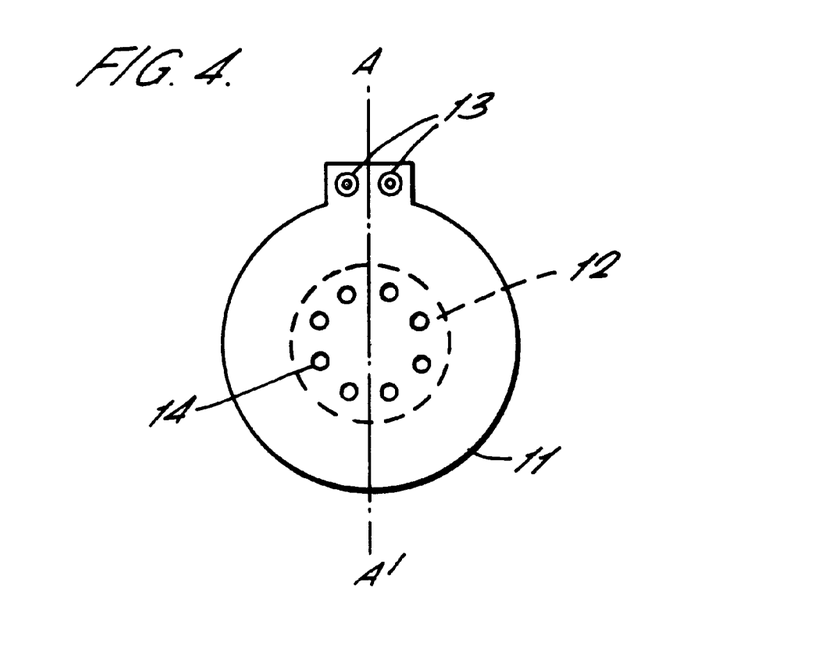
FIG. 4 is a front view of the cover plate of the MBE source shown in FIG. 3.

The figures are not to scale. Referring first to FIGS. 3 and 4, an MBE source according to the invention is shown generally as 8. The source comprises a generally cylindrical crucible 10 held in a support tube 9 by spacer means (not shown). Crucible heaters 15 are disposed within the support tube around the outside of the crucible 10. The crucible heaters 15 serve to heat the crucible so that the material within the crucible is vaporized. A thin cover plate 11 is removably attached so as to cover the open end of the crucible. One means (not shown) of attaching the cover plate to the crucible is by sitting the crucible in a recessed ring, positioning the cover plate and clamping the crucible and cover plate together with another recessed ring which may be screwed or otherwise affixed to the lower ring.

Alternatively, bolts may be screwed through the cover plate itself, or studs may be attached to, for example, a flange surrounding the crucible neck, the studs passing through pre-drilled holes in the cover plate, nuts being used to secure the cover plate in place. The cover plate 11 has a central portion 12 which is convex in shape, and has a number (in this case eight) of circular orifices 14 formed within it. In this example, the orifices are disposed symmetrically around the region 12 but it may be advantageous to form the orifices non-symmetrically—for example to achieve a more uniform flux at the wafer and compensate for any non-perpendicular placing of the crucible.

Figure 5:
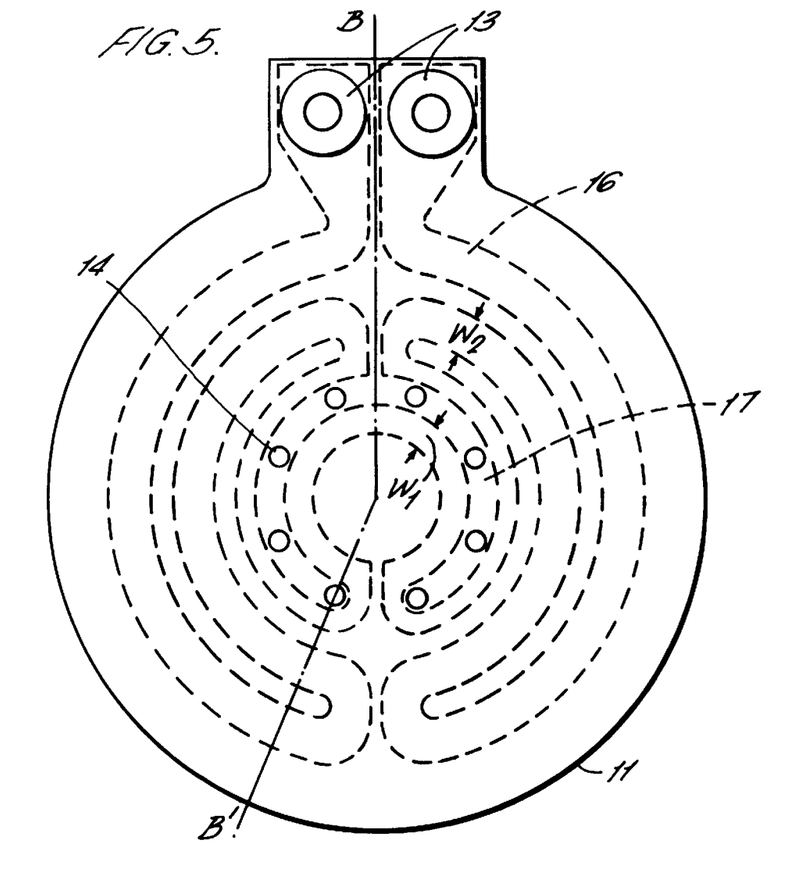
FIG. 5 is a more detailed front view of an MBE cover plate according to the invention, the arrangement of the encapsulated heating means being shown via a dashed line.
Figure 6:
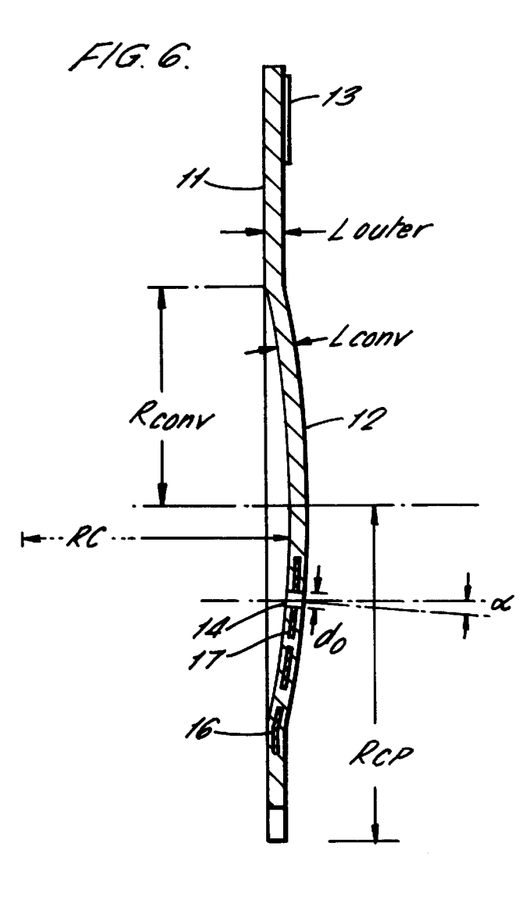
FIG. 6 is a cross-section along lines B–B' in FIG. 5.

The cover plate is shown in more detail in FIGS. 5 and 6. In order to heat the cover plate effectively and controllably, a graphite heater (shown dashed as 16, 17) is encapsulated within the cover plate 11 which may be formed of Pyrolytic Graphite, although it could be mounted on the surface of the cover plate.

The inventors have found that a suitable cover plate may have dimensions as follows—the radius of the cover plate ($R_{CP}$) is typically ~30 mm, the radius of the central convex portion ($R_{CONV}$) being approximately 20 mm. The radius of curvature of the convex portion (RC) is approximately 127 mm. The diameter of each orifice ($d_o$) is approximately 2 mm, and the orifices are arranged around the centre of the cover plate at a distance of around 10 mm from the centre. The thickness of the cover plate is approximately 1.5 mm in the outer portion ($L_{outer}$) and 2 mm in the convex region ($L_{conv}$), so that the orifice length is around 2 mm. The longitudinal axis of each orifice is perpendicular to the surface of the cover plate at the point where the orifice is formed; i.e. the longitudinal axis of each orifice coincides with a radius of the sphere of radius RC which fits the convex portion 12 of the cover plate. The orifices are formed at in angle α (see FIG. 6) of approximately 4°30'. Other suitable dimensions for the cover plate may be used without departing from the scope of the invention. One or more additional orifices may also be provided, for example at the centre of the cover plate.

The cover plate heater 16, 17 is preferably made of a Pyrolytic Graphite layer encapsulated within the cover plate, although a wire heater ma y be used, or alternatively a suitable heater formed on the surface of the cover plate. The heater has two regions; the region 16 disposed away from the orifices 14 being fairly wide ($W_2$ in FIG. 5) and the region 17 disposed in the vicinity of the orifices 14 being narrower ($W_1$ in FIG. 5). In this way, the resistance of the heater is increased in the vicinity of the orifices 14 so that heating will be greater at the orifices. Electrical connectors 13 are also formed which serve to connect the cover plate heater to a source of electrical current.

Figure 7:
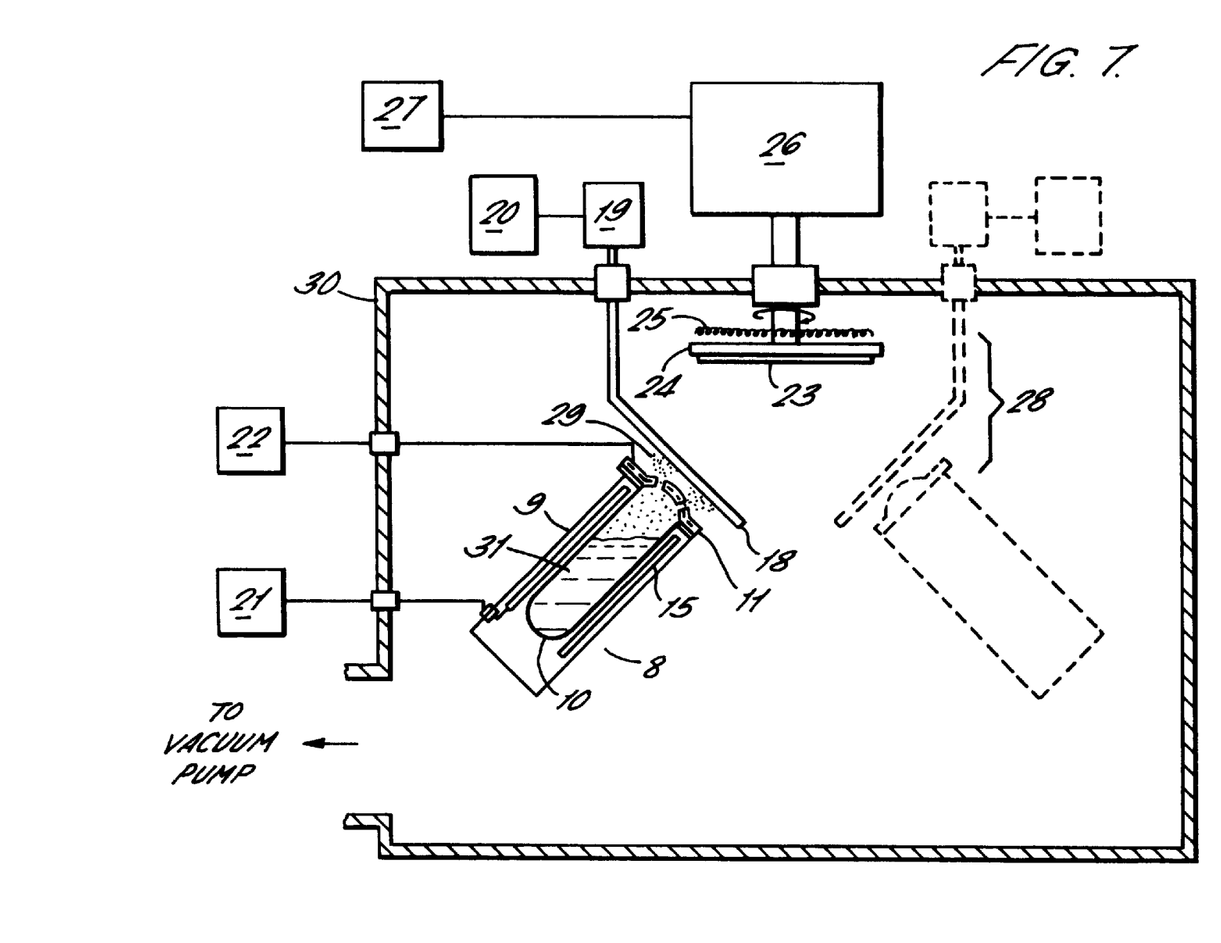
FIG. 7 is a schematic representation of an MBE deposition apparatus.

FIG. 7 is a schematic representation of an MBE apparatus using the above invention. A source 8 comprising a support tube 9, crucible 10, cover plate 11 and crucible heater 15 is disposed within a vacuum housing 30. The crucible heater may be of the type shown in U.S. Pat. No. 4,550,411 or any other suitable type. A substrate 23 upon which material is to be deposited is held by a rotating substrate holder 24 which is heated by a substrate heater 25. Rotation of the substrate holder is effected by drive 26 under the control of drive control means 27, which may also control the power supplied to the heater 25. The substrate holder and its feedthrough are preferably of the type shown in U.S. Pat. No. 4,945,774, although other suitable types may be used.

When Gallium is used as an effusion material, the cell may be operated at around 1100° C. Furthermore, the cap temperature may advantageously be the same as or greater than the cell temperature. When other materials are used, the optimum operating temperature may differ.

Source 8 has a corresponding shutter 18, which is arranged so that in its closed position (shown in the diagram) it prevents effused material 29 from source 8 from reaching the substrate 23. Shutter 18 may be moved from its closed position to an open position, where it does not interfere with the path of the effused material 29, by shutter drive means 19, under the control of shutter control means 20. The shutter shown in the figure is a rotating type shutter, but other shutter movements may also be used, in particular that shown in U.S. Pat. No. 5,026,454 which is preferred.

Crucible heater 15 is controlled by control means 21 so as to heat the material 31 contained inside the crucible (typically Gallium, Indium, Aluminium, Zinc, Cadmium or Tellurium) to form beams 29 of effused material. The cover plate heater is controlled by control means 22. Other source assemblies (e.g. 28, shown dashed) may also be provided, so that epitaxial layers of different materials may be grown on substrate 23.

Control means 20, 21, 22, and 27 may be a suitably programmed computer. Typical materials used for the MDE apparatus are Pyrolytic Boron Nitride (typically 99.999% pure) for the crucible and tantalum wire or foil for the crucible heater. The crucible heater may have heat shields (not shown) associated with it, and a cooling shroud (not shown) may be associated with the or each source. Other parts of the MBE apparatus are conventional and have not been described.

Preferably the cover plate 11 and integral heater 16, 17 are formed by a deposition process. Typically, a first layer of Pyrolytic Boron Nitride forms the base layer of the cover plate. This layer is typically ~1.7 mm thick and is formed having a convex portion as shown. The pyrolytic graphite heater layer (typically 0.05 mm thick) is then deposited upon the base layer. This heater layer is then machined to form a track as indicated by 16 in FIG. 5. As mentioned previously, the heater layer may typically be wider at the outer part of the cover member and narrower in the region of orifice formation, so that more heat will be generated in the orifice region when the source is in operation. The orifices 14 are then formed e.g. by drilling with diamond-coated drills or laser drilling for very small holes. Then, the top layer of Pyrolytic Boron Nitride is grown, this top layer being typically 0.25 mm thick. Subsequently the PBN cover layer is removed in the area of the electrical contacts and finally the underside is machined to give a flat surface and a rim thickness of typically 1.5 mm. The orifices are typically 2 mm in diameter.

Figure 8:
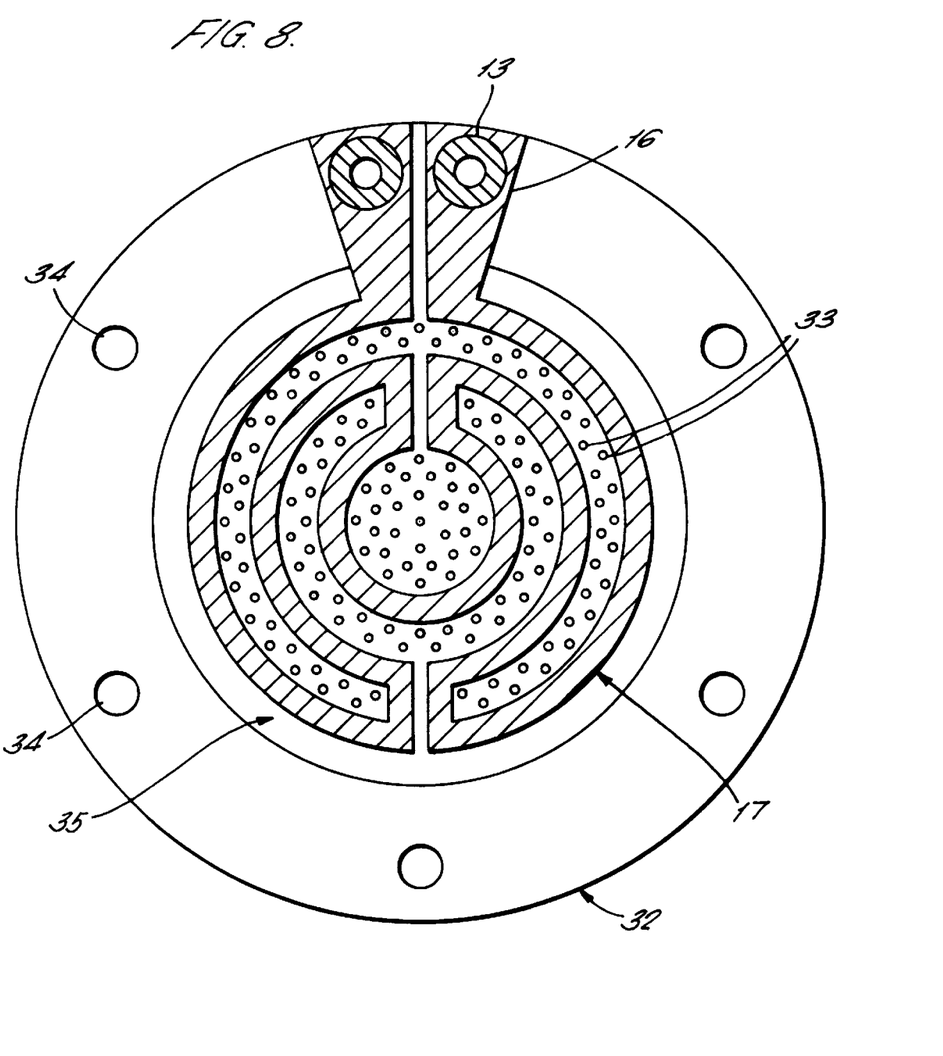
FIG. 8 is a front view of a cover plate according to a further preferred embodiment of the invention.
Figure 9:
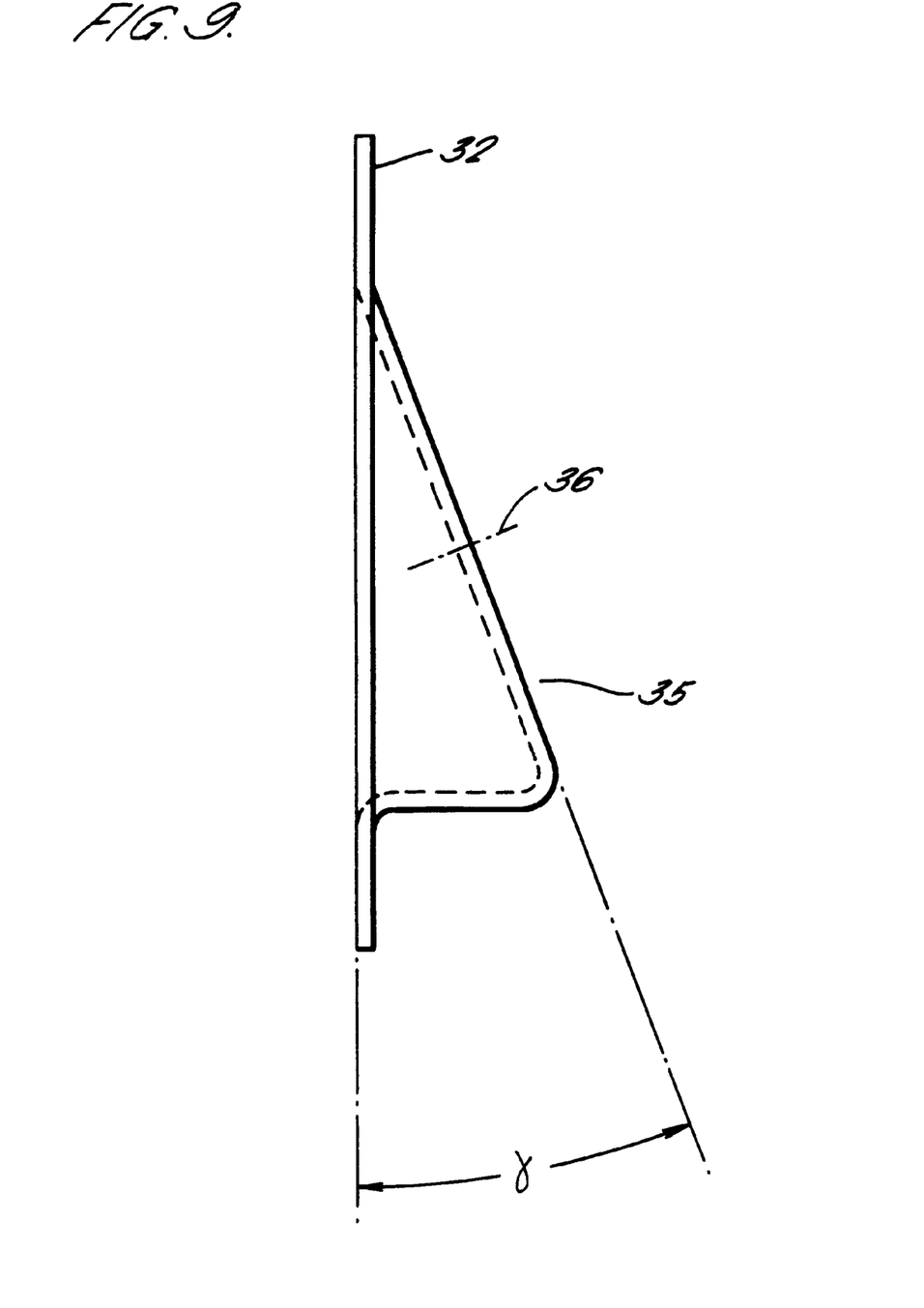
FIG. 9 is a side view of the cover plate of FIG. 8.
Figure 10:
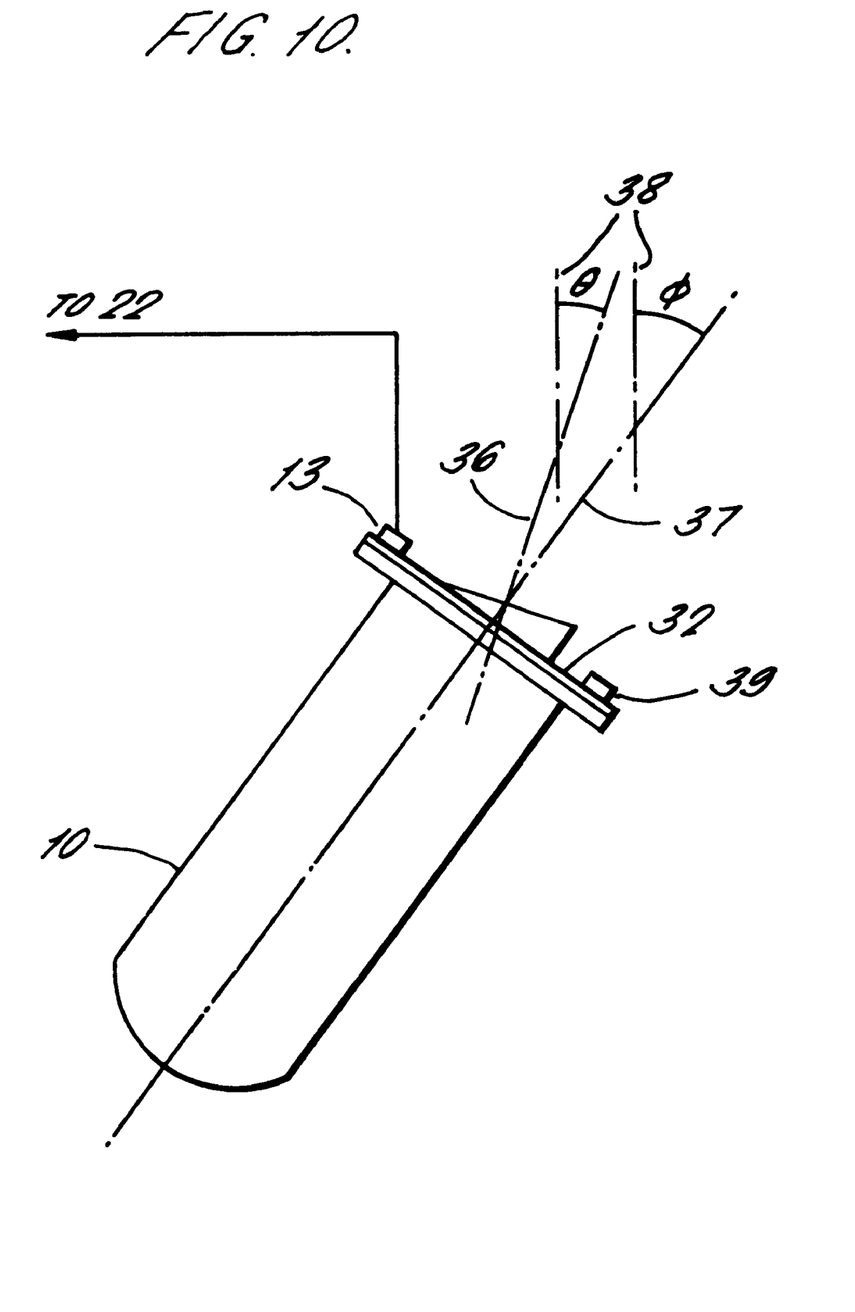
FIG. 10 is a schematic representation of the crucible of the further preferred embodiment in use.

FIGS. 8, 9 and 10 show a further preferred embodiment of the invention. The cover plate (32) of this embodiment also has an encapsulated Pyrolytic Graphite heater (16, 17) with electrical contacts (13). The number of orifices (33) has, however been increased—in this example there are over 140—it having been found that there is some advantage in this in terms of uniformity of deposition. The orifices (33) are also typically smaller, being only 1 mm wide.

It has been found that the presence of the encapsulated heater (16, 17) is sufficient to prevent substantial orifice blockage. In this particular example, the cover plate is attached by means of studs attached to a flange surrounding the crucible neck, the studs passing through pre-drilled holes in the cover plate, nuts (e.g. 39, FIG. 10) being used to secure the cover plate in place. Furthermore, the cover plate is profiled as shown in FIG. 9, having a profiled portion (35) in the centre of the cover plate (32) which is manufactured at an angle γ (gamma) (in this example, approximately 20°) to the outer portion of the cover plate. The orifices (33) are formed in this flat, circular region (the region being flat for ease of manufacture) and the orifice axes are perpendicular to the plane of the central region (35), one orifice axis (36) being shown diagrammatically in FIG. 9.

FIG. 10 shows the cover plate (32) in use. Only the crucible (10) and cover plate (32) are shown, the crucible support tube, crucible heater and rest of the deposition apparatus having been omitted. The longitudinal axis (37) of the crucible is disposed at an angle φ (phi) to the vertical (38), which is typically around 36°. The orifice axis (36) is therefore disposed at an angle Θ (theta) (=φ-γ) to the vertical. Typically this angle is around 16°. This improves uniformity of deposition at the wafer compared to having the orifice axis parallel to the crucible axis.

I claim:

1. A source for molecular beam epitaxy including an open-ended crucible and a removable cover plate for covering the open end of the crucible, at least one orifice being formed in the cover plate, characterized in that a heating means is provided for heating the cover plate, said heating means being formed on or within the cover plate.

2. A source as claimed in claim 1 wherein the heating means is formed of a suitable refractory material on the surface of the cover plate.

3. A source as claimed in claim 1 wherein the cover plate and heating means may be formed by a layer deposition process.

4. A source as claimed in claim 1 wherein the heating means is encapsulated within the cover plate.

5. A source as claimed in claim 4 wherein the heating means comprises a layer of electrically conductive material encapsulated within the cover plate, the cover plate being formed of an electrically insulating material.

6. A source as claimed in claim 5 wherein a portion of said heating means is disposed in the vicinity of the or each orifice and the electrical resistance of the or each said portion of the heating means in the vicinity of an orifice is increased, so that more heat may be generated near an orifice.

7. A source as claimed in claim 1 wherein a portion of said heating means is disposed in the vicinity of the or each orifice.

8. A source as claimed in claim 7 wherein a portion of said heating means substantially surrounds the orifice.

9. Apparatus for the deposition of layers on a substrate by Molecular Beam Epitaxy, said apparatus consisting of an evacuated housing containing a substrate holder for holding the substrate and one or more sources for generating a beam of material, the source and substrate being disposed so that material from the source is deposited on the substrate, at least one said being as described in claim 1.

10. A cover plate suitable for use with the source of claim 1.

* * * * *